United States Patent
Boivin et al.

(10) Patent No.: US 10,128,314 B2
(45) Date of Patent: Nov. 13, 2018

(54) VERTICAL BIPOLAR TRANSISTOR

(71) Applicant: STMicroelectronics (Rousset) SAS, Rousset (FR)

(72) Inventors: Philippe Boivin, Venelles (FR); Francesco La Rosa, Rousset (FR); Julien Delalleau, Marseilles (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 15/398,228

(22) Filed: Jan. 4, 2017

(65) Prior Publication Data

US 2017/0117326 A1    Apr. 27, 2017

Related U.S. Application Data (63) Continuation of application No. 14/150,596, filed on Jan. 8, 2014, now Pat. No. 9,570,513.

(30) Foreign Application Priority Data

Jan. 8, 2013 (FR) ...................................... 13 50133

(51) Int. Cl.

| | |
|---|---|
| H01L 21/8224 | (2006.01) |
| H01L 21/336 | (2006.01) |
| H01L 21/337 | (2006.01) |
| H01L 27/24 | (2006.01) |
| H01L 29/732 | (2006.01) |
| H01L 29/66 | (2006.01) |
| H01L 45/00 | (2006.01) |

(52) U.S. Cl.
CPC .... *H01L 27/2445* (2013.01); *H01L 29/66272* (2013.01); *H01L 29/732* (2013.01); *H01L 45/16* (2013.01)

(58) Field of Classification Search
CPC ........... H01L 27/2445; H01L 29/66272; H01L 29/732; H01L 45/16
See application file for complete search history.

(56) References Cited

U.S. PATENT DOCUMENTS

| | | | |
|---|---|---|---|
| 5,455,185 A | 10/1995 | Klose | |
| 2002/0089038 A1 | 7/2002 | Ning | |
| 2008/0105878 A1* | 5/2008 | Ohara | H01L 29/8613 257/74 |
| 2008/0185571 A1 | 8/2008 | Happ et al. | |
| 2009/0302294 A1 | 12/2009 | Kim | |
| 2010/0163830 A1* | 7/2010 | Chang | H01L 27/2409 257/3 |
| 2010/0295009 A1 | 11/2010 | Lung et al. | |
| 2011/0006377 A1 | 1/2011 | Lee et al. | |

* cited by examiner

*Primary Examiner* — Su C Kim
(74) *Attorney, Agent, or Firm* — Seed IP Law Group LLP (57) ABSTRACT

The disclosure relates to an integrated circuit comprising a transistor comprising first and second conduction terminals and a control terminal. The integrated circuit further comprises a stack of a first dielectric layer, a conductive layer, and a second dielectric layer, the first conduction terminal comprising a first semiconductor region formed in the first dielectric layer, the control terminal comprising a second semiconductor region formed in the conductive layer, and the second conduction terminal comprising a third semiconductor region formed in the second dielectric layer.

20 Claims, 4 Drawing Sheets

VERTICAL BIPOLAR TRANSISTOR

BACKGROUND

Technical Field

The present disclosure relates to a vertical bipolar transistor, and a method of fabricating thereof. The disclosure also relates to a memory cell comprising such a transistor.

Description of the Related Art

Resistive random access memory (commonly abbreviated as RRAM or ReRAM) is a type of non-volatile memory wherein data is represented by the resistance value of resistive storage elements, each comprising a resistive material between two metal electrodes. When a voltage is applied across the electrodes, conductive paths appear in the resistive material, causing its resistance value to vary between at least two states. A selection element, such as a diode or transistor, is commonly associated with each storage element for selective access thereto.

Figures 1, 2:
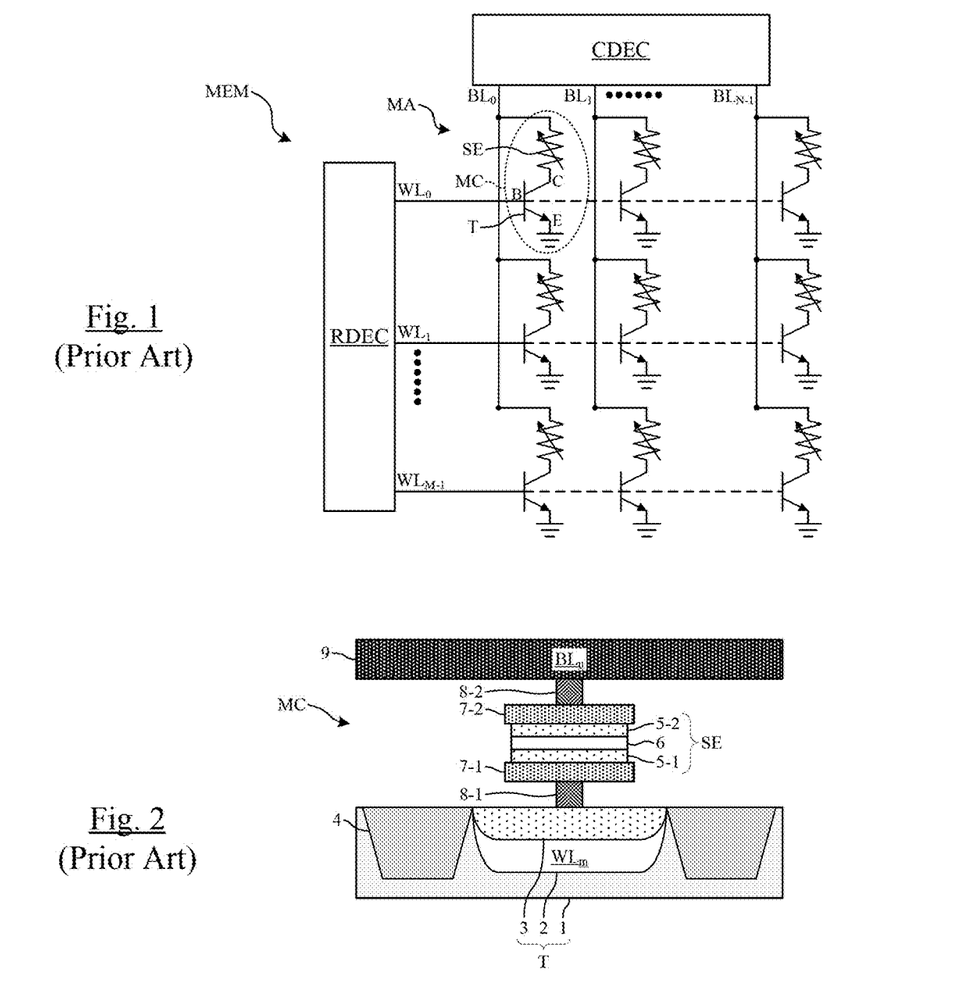

FIG. 1 shows a nonvolatile memory MEM comprising an array MA of resistive memory cells MC, M wordlines $WL_m$ ($WL_0$ to $WL_{M-1}$), N bitlines $BL_n$ ($BL_0$ to $BL_{N-1}$), a row decoder RDEC, and a column decoder CDEC. The array MA comprises M×N memory cells MC arranged in rows and columns. Each memory cell MC is coupled to the row decoder RDEC by one wordline $WL_m$ and to the column decoder CDEC by one bitline $BL_n$. Each memory cell MC comprises a data storage element SE and a transistor T. The transistor T comprises a control terminal B coupled to a wordline $WL_m$, a first conduction terminal E coupled to ground, and a second conduction terminal C coupled to a first electrode of the corresponding storage element SE. The storage element has a second electrode coupled to a bitline $BL_n$.

FIG. 2 is a cross-sectional view of the memory cell MC. The transistor T is formed in a semiconductor substrate 1 of a first conductivity type (N, P). The substrate comprises a doped well 2 of a second conductivity type (P, N), a doped region 3 of the first conductivity type formed in the well, and shallow trench isolations 4 on each side of the well 2. For a transistor T of the NPN bipolar junction transistor type, the substrate 1 and the region 3 are N-doped and form conduction terminals (E, C), and the well 2 is P-doped and forms the control terminal (B) of the transistor. The substrate 1 is grounded and the well 2 further forms a wordline $WL_m$ for all memory cells formed in the well.

The storage element SE is formed above the top surface of the substrate and comprises a bottom electrode 5-1, a top electrode 5-2, and a resistive material 6 between the electrodes. The bottom electrode 5-1 is coupled by means of a supporting bottom plate 7-1 and a lower contact 8-1 to the doped region 3, and the top electrode 5-2 is coupled by means of a top plate 7-2 and a top contact 8-2 to a conductive path 9, which forms a bitline $BL_n$. Each of the elements 5-1, 5-2, 6, 7-1, 7-2, 8-1, 8-2, 9 is formed in one or more dielectric layers, not shown for the sake of clarity.

Figure 3:
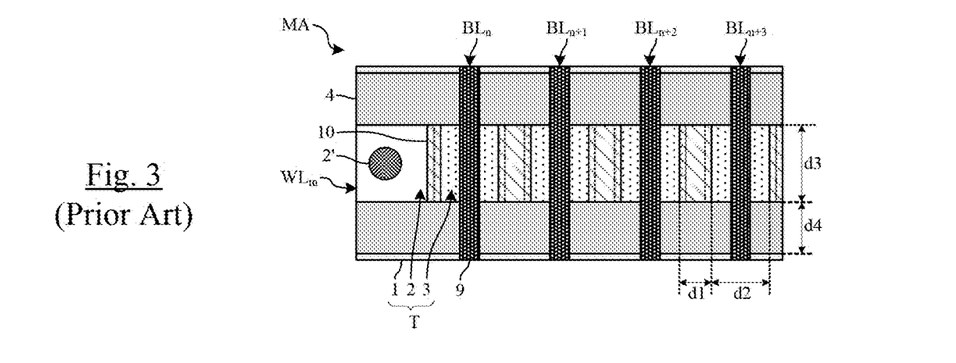

FIG. 3 is a top view of four conventional memory cells formed at the intersections of one wordline $WL_m$ and four adjacent bitlines, $BL_n$ to $BL_{n+3}$. For the sake of clarity, only the transistors T are shown for each memory cell. A wordline contact 2' is provided to couple the well 2 to the row decoder RDEC (not shown).

Generally only a small number of memory cells can be formed within a single well, otherwise the series resistance of the well is too high. In order to reduce the resistance, the upper surface of the substrate may be silicided. Nevertheless, such a silicidation process short-circuits the well 2 and the doped regions 3, of opposite conductivity types, unless spacers 10 are previously formed above the junctions of the well 2 and regions 3. However, providing such spacers increases the size of each memory cell, determined by the width d1 and the separation d2 of the spacers 10 in one direction, and the width d3 and the separation d4 of the wells 2 in the other direction.

It may therefore be beneficial to provide a transistor of reduced size.

BRIEF SUMMARY

Embodiments of the disclosure relate to an integrated circuit comprising a transistor comprising first and second conduction terminals and a control terminal. The integrated circuit further comprises a stack of a first dielectric layer, a conductive layer, and a second dielectric layer, wherein the first conduction terminal of the transistor comprises a first semiconductor region of a first conductivity type formed in the first dielectric layer, the control terminal of the transistor comprises a second semiconductor region of a second conductivity type formed in the conductive layer, and the second conduction terminal of the transistor comprises a third semiconductor region of the first conductivity type formed in the second dielectric layer.

According to one embodiment, the conductive layer is a semiconductor material comprising dopants of the second conductivity type, and the second region comprises a diffusion profile wherein the lateral edges are thicker than the middle.

According to one embodiment, the stack of layers is formed on the surface of a semiconductor substrate, the substrate comprising a well comprising dopants of the first conductivity type underlying at least the first region.

According to one embodiment, the first region comprises a diffusion profile wherein the middle is thicker than the lateral edges of the region.

Embodiments of the disclosure also relate to a memory cell comprising a data storage element linked to a transistor according to one embodiment of the disclosure.

According to one embodiment, the data storage element is a resistive storage element comprising a first metal electrode, a resistive material, and a second metal electrode, and wherein one of the electrodes is coupled to a conduction terminal of the transistor.

Embodiments of the disclosure also relate to an array of memory cells according to one embodiment of the disclosure, the memory cells being arranged in at least one row, wherein the conductive layer is coupled to the control terminals of all memory cells of the row.

Embodiments of the disclosure also relate to a device comprising an integrated circuit according to one embodiment of the disclosure.

Embodiments of the disclosure also relate to a method of fabricating an integrated circuit comprising a transistor comprising first and second conduction terminals and a control terminal. The method comprises the steps of: forming a stack of a first dielectric layer, a conductive layer, and a second dielectric layer; forming the first conduction terminal of the transistor as a first semiconductor region of a first conductivity type in the first dielectric layer; forming the control terminal of the transistor as a second semiconductor region of a second conductivity type in the conductive layer; and forming the second conduction terminal of the transistor as a third semiconductor region of the first conductivity type in the second dielectric layer.

According to one embodiment, the method comprises the steps of etching a hole through at least one of the layers and depositing a semiconductor material in the hole.

According to one embodiment, the conductive layer is a semiconductor material comprising dopants of the second conductivity type, and the method comprises a step of diffusing dopants from the conductive layer to form the second region.

According to one embodiment, the method comprises the steps of: forming, in a semiconductor substrate, a well comprising dopants of the first conductivity type, the well underlying at least the first region; and diffusing dopants of the first conductivity type from the doped well into the semiconductor material in the hole to form the first region.

According to one embodiment, the method comprises the steps of implanting dopants of the first conductivity type into the top surface of the semiconductor material, and diffusing the dopants into the semiconductor material in the hole to form the third region.

BRIEF DESCRIPTION OF THE SEVERAL VIEWS OF THE DRAWINGS

Embodiments of the present disclosure will now be described in connection with, but not limited to, the appended drawings in which:

FIG. 1, previously described, shows a conventional non-volatile memory comprising a plurality of memory cells, FIG. 2, previously described, shows a cross-sectional view of a memory cell comprising a conventional transistor, FIG. 3, previously described, shows a top view of a plurality of memory cells as shown in FIG. 2.

DETAILED DESCRIPTION

Figure 4:
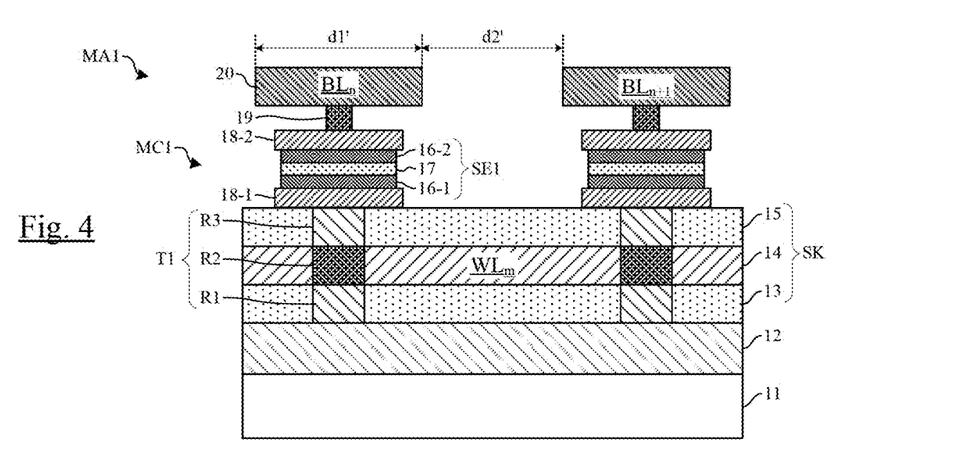
FIG. 4 shows a cross-sectional view of memory cells comprising a transistor according to a first embodiment of the disclosure.
Figure 5:
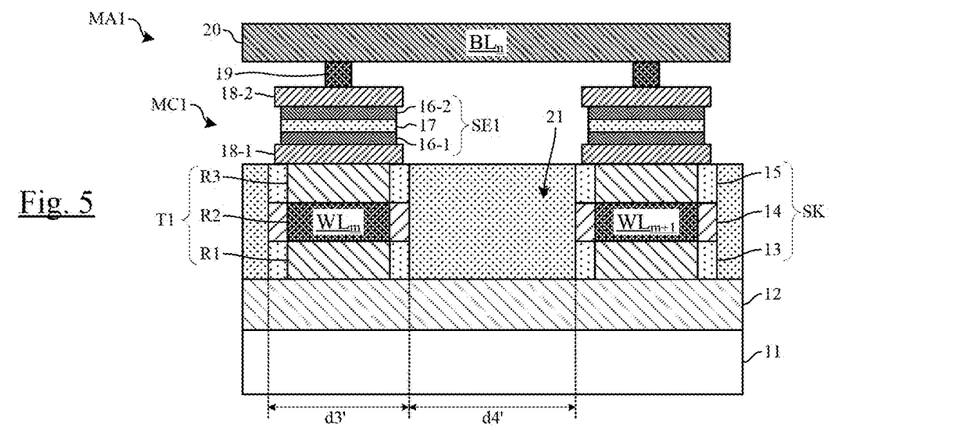
FIG. 5 shows another cross-sectional view of the memory cells comprising the transistor according to the first embodiment of the disclosure.

FIGS. 4 and 5 are cross-sectional views along perpendicular axes of memory cells MC1 comprising a transistor according to a first embodiment of the disclosure. The memory cells MC1 are part of an array of memory cells MA1, similar to that shown in FIG. 1. The memory cells MC1 shown in FIG. 4 are coupled to a same wordline $WL_m$ and to adjacent bitlines $BL_n$, $BL_{n+1}$. The memory cells MC1 shown in FIG. 5 are coupled to a same bitline $BL_n$ and to adjacent wordlines $WL_m$, $WL_{m+1}$.

As shown in FIGS. 4 and 5, each memory cell MC1 comprises a storage element SE1 and a transistor T1 formed on a semiconductor substrate 11 comprising a doped well 12 of a first conductivity type (N, P). A stack SK of a first dielectric layer 13, a conductive layer 14, and a second dielectric layer 15 overlies the top surface of the substrate 11 and the well 12. The conductive layer 14 forms a common wordline $WL_m$ for a plurality of memory cells. In FIG. 5, it may be noted that the stack SK is formed in a dielectric material 21, comprising one or more dielectric layers.

The transistor T1 comprises a first region R1 of the first conductivity type (N, P) formed in the first dielectric layer 13, a second region R2 of a second conductivity type (P, N) formed in the conductive layer 14, and a third region R3 of the first conductivity type (N, P) formed in the second dielectric layer 15. The first and third regions R1, R3 form the conduction terminals (C, E) of the transistor T1, and the second region R2 forms the control terminal (B) of the transistor. The regions R1, R2, R3 are essentially vertically aligned.

The storage element SE1 comprises a bottom electrode 16-1, a top electrode 16-2, and a resistive material 17 between the electrodes. The bottom electrode 16-1 is coupled by means of a supporting bottom plate 18-1 to the third region R3, and the top electrode 16-2 is coupled by means of a top plate 18-2 and a top contact 19 to a conductive path 20 (bitlines $BL_n$, $BL_{+1}$). Each of the elements 16-1, 17, 16-1, 18-1, 18-2, 19, 20 is formed in one or more dielectric layers, not shown for the sake of clarity.

The vertical structure of the transistor T1 allows the memory cell MC1 size to be reduced to the minimum feature sizes and separations as defined by layout design rules, particularly the design rules concerning the conductive path 20 and the conductive layer 14. In particular, the distance between adjacent memory cells MC1 along the direction of the wordline $WL_m$ is defined by the width d1' and the separation d2' of the conductive paths 20 (as shown in FIG. 4), and the distance between adjacent memory cells MC1 along the direction of the bitline $BL_n$ is defined by the width d3' and the separation d4' of the conductive layers 14 (as shown in FIG. 5). As a result, a greatly reduced memory cell MC1 size as compared to the conventional memory cell MC is obtained.

As a numerical example, with reference to FIG. 3, the conventional memory cell MC has the following values for a semiconductor fabrication technology of 0.18 µm: d1=0.240 µm, d2=0.400 µm, d3=0.200 µm, and d4=0.200 µm, giving a memory cell size equal to 0.256 µm². In comparison, using the same fabrication process, the memory cell MC1 according to the disclosure has the following values: d1'=0.240 µm, d2'=0.240 µm, d3'=0.180 µm, and d4'=0.200 µm, for a total memory cell size of 0.182 µm², approximately 30% smaller than the conventional memory cell MC.

FIGS. 6A to 6F show steps of a method of fabricating a transistor according to one embodiment of the disclosure. It should be noted that for ease of description, the steps are described below in relation with the fabrication of an NPN transistor, but are equally applicable to the fabrication of a PNP transistor.

Figure 6A:
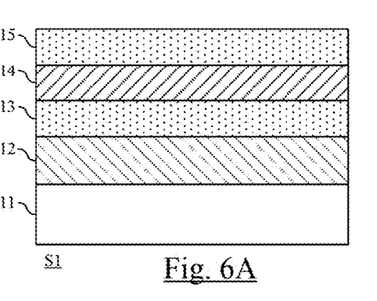
FIGS. 6A to 6F show steps of a method of fabricating a transistor according to one embodiment of the disclosure.

FIG. 6A shows a step S1, wherein the doped well 12 with N conductivity type dopants is formed in the semiconductor substrate 11. The first dielectric layer 13, the conductive layer 14, and the second dielectric layer 15 are then successively deposited above the well 12, forming the stack of layers. In this embodiment, the layer 14 is a semiconductor material, such as polycrystalline silicon or "polysilicon", and comprises P conductivity type dopants.

Figure 6B:
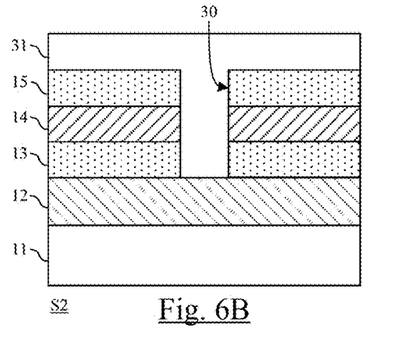

FIG. 6B shows a step S2, wherein a hole 30 is etched through the stack of layers 13, 14, 15 until the top surface of the semiconductor substrate 11 is reached. This step is performed in a conventional manner, for example comprising the deposition and patterning of an etching mask (not shown), which is then removed. A semiconductor material 31, such as undoped polysilicon, is then deposited on the top surface of the stack, filling the hole 30.

Figure 6C:
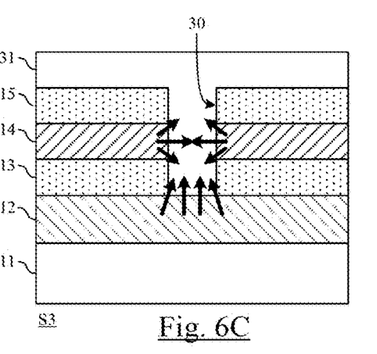

FIG. 6C shows a step S3, wherein a thermal diffusion is performed. In the case of polysilicon, the semiconductor material 31 begins to crystallize while the P-type dopants in the conductive layer 14 diffuse laterally into the semiconductor material 31, and the N-type dopants in the well 12 diffuse vertically upward, also into the material 31. The diffusion process is designed to allow the P-type dopants of the layer 14 on either side of the hole 30 to diffuse into the semiconductor material 31 and merge together, forming a continuous P-type region.

Figure 6D:
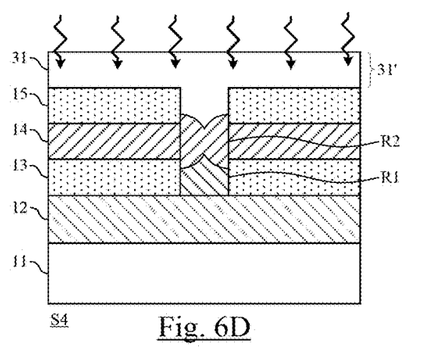

FIG. 6D shows a step S4, wherein N-type dopants are then implanted into the top surface 31' of the semiconductor material. It may be noted in FIG. 6D that the diffusion of the N-type dopants from the well 12 has formed the N-type first region R1 in the first dielectric layer 13, and that the diffusion of the P-type dopants from the conductive layer 14 has formed the P-type second region R2 in the conductive layer 14. The regions R1, R2 respectively form the first conductive terminal (E, C) and control terminal (B) of the transistor T1.

Figure 6E:
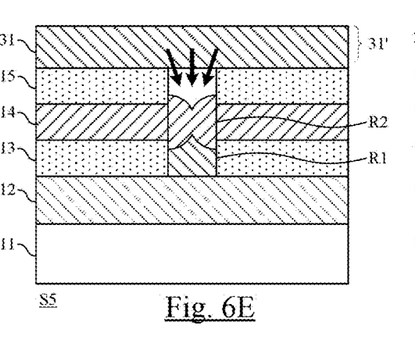
Figure 6F:
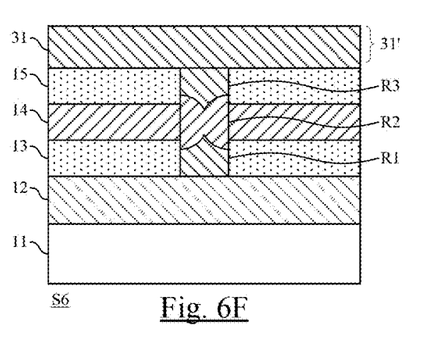

FIG. 6E shows a step S5, wherein another thermal diffusion is performed. The N-type dopants implanted in the top surface 31' of the semiconductor material 31 diffuse vertically downward into the hole 30. As shown in FIG. 6F, the diffusion of the N-type dopants from the layer 31' has formed the N-type third region R3 in the second dielectric layer 15. Region R3 forms the second conductive terminal (C, E) of the transistor T1. The data storage element SE1 may then be formed above the transistor by conventional processing steps.

It may be noted in FIG. 6F that the first region R1 presents a first diffusion profile, the second region R2 presents a second diffusion profile, and the third region R3 presents a third diffusion profile. The first and third diffusion profiles are thinner on the lateral edges and wider in the middle. The second diffusion profile is wider on the lateral edges and thinner in the middle where the two parts merge, with curved upper and lower edges, forming a type of "butterfly" shape. Moreover, the concentrations of the dopants within each region are generally non-constant, varying by several degrees of magnitude. In particular, the concentration of the dopants is the highest near the dopant source, respectively the well 12, the conductive layer 14, and the top surface 31' of the semiconductor material 31. It will be apparent to the skilled person that these diffusion profiles are observable by conventional microscopy/spectroscopy means, such as Electron Energy Loss Spectroscopy or "EELS".

Figure 7A:
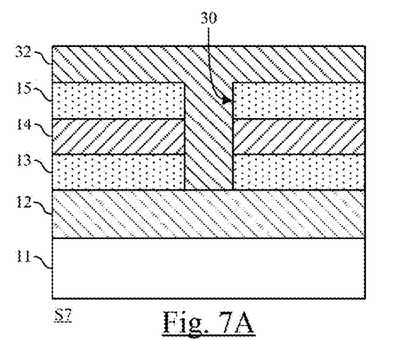
FIGS. 7A and 7B show steps of a method of fabricating a transistor according to another embodiment of the disclosure.
Figure 7B:
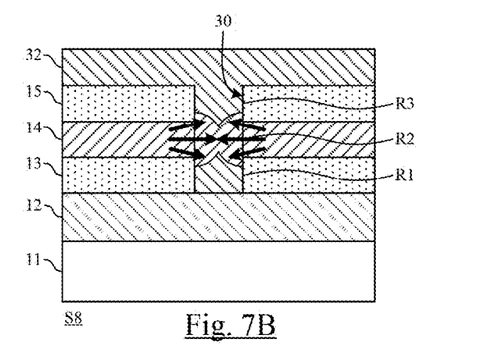

FIGS. 7A and 7B show steps of a method of fabricating a transistor according to another embodiment.

FIG. 7A shows a step S7, wherein the first dielectric layer 13, the conductive layer 14, and the second dielectric layer 15 are deposited above the N-doped well 12 in the substrate 11. The hole 30 is etched through the stack of layers 13, 14, 15 until the top surface of the well 12 is reached. An N-doped semiconductor material 32 is then deposited above the layers, filling the hole 30. In this embodiment, the layer 14 is a semiconductor material with a heavy doping of P conductivity type dopants.

FIG. 7B shows a step S8, wherein a thermal diffusion is performed. The P-type dopants present in the heavily-doped layer 14 diffuse into the N-doped material 32, "counter-doping" the conductivity type from N to P in the region between the conductive layers 14. As previously, the transistor comprises first, second, and third regions R1, R2, R3 respectively formed in the layers 13, 14, 15.

Figure 8A:
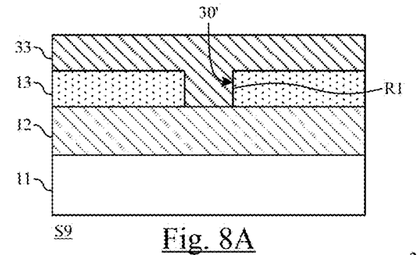
FIGS. 8A to 8C show steps of a method of fabricating a transistor according to another embodiment of the disclosure.
Figure 8B:
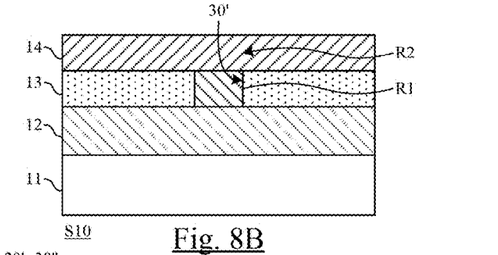
Figure 8C:
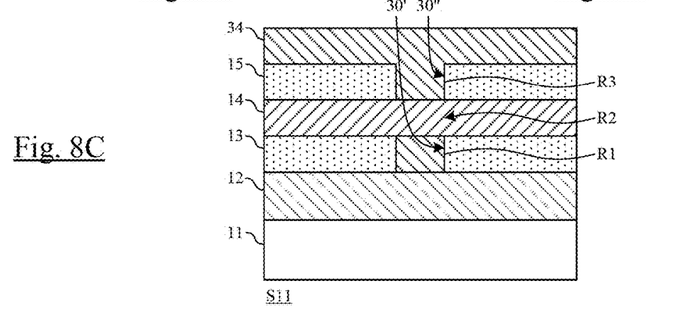

FIGS. 8A to 8C show steps of a method of fabricating a transistor according to another embodiment.

FIG. 8A shows a step S9, wherein the first dielectric layer 13 is deposited on the surface of the substrate 11 comprising the N-doped well 12. A first hole 30' is etched in the first layer 13 until the top surface of the well 12 is reached. An N-doped semiconductor material 33 is then deposited on the top surface of the dielectric layer 13, filling the hole 30', and forming the first region R1. The excess semiconductor material 33 extending above the hole is then removed.

FIG. 8B shows a step S10, wherein the conductive layer 14 is deposited above the first dielectric layer 13 and the first region R1. In this embodiment, the layer 14 is a semiconductor material doped with P conductivity type dopants. The second region R2 is formed as a portion of the conductive layer 14. Thus, it should be noted that the region R2 is not necessarily distinct from the conductive layer 14, but may be a continuous portion thereof.

FIG. 8C shows a step S11, wherein the second dielectric layer 15 is deposited above the conductive layer 14. A second hole 30" is etched in the second layer 15 until the conductive layer 14 is reached. An N-doped semiconductor material 34 is then deposited on the top surface of the dielectric layer 15, filling the hole 30" and forming the third region R3. The excess semiconductor material 34 extending above the hole may then be removed or used for further processing steps.

It will be apparent to the skilled person that the transistor is not necessarily formed directly on the substrate surface. In particular, a storage element may be formed between the substrate surface and the transistor.

Figure 9:
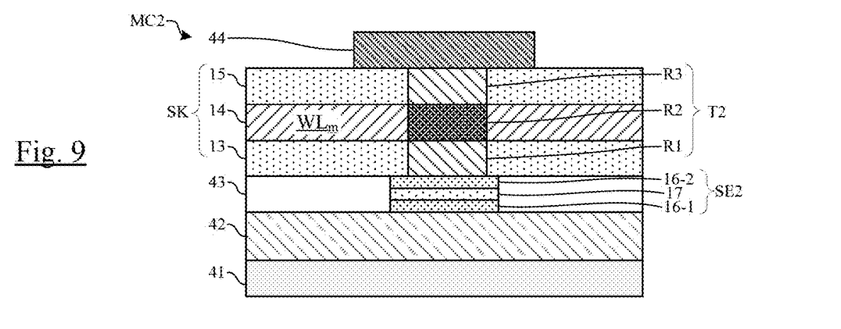
FIG. 9 is a cross-sectional view of a memory cell comprising a transistor according to another embodiment of the disclosure.

FIG. 9 is a cross-sectional view of a memory cell MC2 comprising a transistor according to another embodiment of the disclosure.

The memory cell MC2 comprises a storage element SE2 and a transistor T2 formed on a semiconductor substrate 41 comprising a doped well 42 of a first conductivity type. One or more dielectric layers 43 are deposited on the top surface of the substrate 41. The storage element SE2, comprising the electrodes 16-1 and 16-2 separated by the resistive material 17, is formed in the dielectric layer(s) 43.

The stack SK of the first dielectric layer 13, the conductive layer 14, and the second dielectric layer 15 is formed on the top surface of the dielectric layer(s) 43. The first, second, and third regions R1, R2, R3 are formed in each layer respectively, in a manner similar to those previously described. A conductive path 44 is deposited above the stack, and is electrically coupled to the third region R3.

Figure 10:
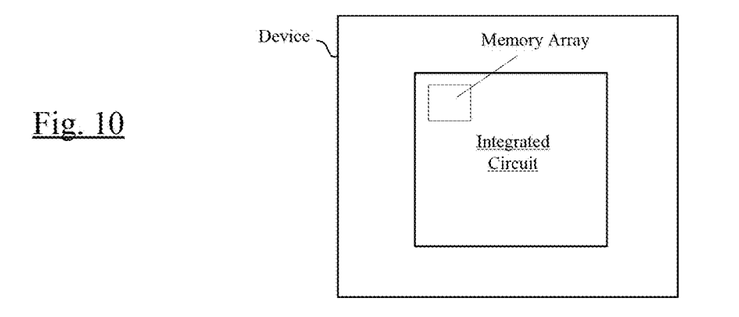
FIG. 10 shows a device comprising an integrated circuit according to one embodiment of the disclosure.

FIG. 10 schematically shows a device DV comprising an integrated circuit IC. The integrated circuit comprises a transistor T1, T2 according to the disclosure. The transistor T1, T2 may belong to an array of memory cells forming a memory, which may be used both to store code (in particular application programs) and application data. The device DV may be a contactless chip card, a tag, a mobile phone, a Personal Digital Assistant, etc., and may further comprise a contactless communication interface circuit to which the memory is connected. The interface circuit may be an NFC interface circuit (Near Field Communication) connected to an antenna coil, configured to exchange data by inductive coupling and load modulation. The device DV may be configured to communicate with an external device such as a contactless card or tag reader, a POS (Point of Sale), another NFC mobile phone, etc.

It will be apparent to the skilled person that the disclosure is susceptible to various other embodiments and applications. For example, the memory may be other than a resistive memory (RRAM), such as a phase change memory (PCRAM), magnetic memory (MRAM), ferromagnetic (FRAM), dynamic memory (DRAM), static memory (SRAM), and the like.

Furthermore, while the transistors T1, T2 have been described in relation with data storage elements to form memory cells, it will be understood by the skilled person that the transistors may be used alone for other applications, or even stacked.

It will be understood that the dimensions of each layer 13, 14, 15, and the holes 30, 30', 30" may be chosen as needed, depending on the fabrication process, the properties of the transistor, and the diffusion and implantation processes implemented. As a numerical example, the first dielectric layer 13 has a thickness between 100 and 500 angstroms, the conductive layer 14 has a thickness between 500 and 2500 angstroms, and the second dielectric layer 15 has a thickness between 500 and 1000 angstroms. The thickness of the conductive layer 14 in particular may be chosen depending on the diffusion process, the amount of current to circulate, etc. Furthermore, the width of the hole 30, 30', 30" may be chosen depending on the diffusion process, in particular to ensure that the dopants diffused from the conductive layer 14 on each side of the hole merge together, in order to form the second region R2.

It is within the purview of the skilled person to select the doping concentrations, implantation depths, diffusion temperature and time, etc. to obtain selected transistor properties. For the method shown in relation with FIGS. 6A to 6F, the doping concentrations of the well 12, the conductive layer 14, and the semiconductor material 31' may be approximately equal, for example on the order of $10^{20}$ to $10^{21}$ cm$^{-3}$. For the method shown in relation with FIGS. 7A, 7B, the conductive layer 14 may be doped two or more orders higher than that of the semiconductor material 32, for example $10^{22}$ cm$^{-3}$ as compared to $10^{20}$ cm$^{-3}$, so that the semiconductor material 32 can "counter-dope" the doping in the second region R2.

Furthermore, the methods of fabricating the transistor may be carried out in different manners, as will be apparent to the skilled person. For example, in one embodiment, rather than depositing a semiconductor material in the etched hole, the semiconductor material may be grown by means of epitaxial growth, and doped as needed during the growth. In one embodiment, instead of forming the doped well 12 before depositing the first dielectric layer 13, the area of the substrate 11 underlying the regions R1, R2, R3 may be locally implanted after the hole 30 has been etched. Furthermore, while the conductive line 14 has been described in the preceding as a semiconductor material, it may for example be a metal line etched and filled with a doped semiconductor material forming the control terminal of the transistor.

It may be noted that the outer lateral edges of the conductive layer 14, as shown in FIG. 5, may be formed according to several different methods. In particular, the stack SK of layers 13, 14, 15 may be etched by the same etching step as that of the hole 30, or else by a separate etching step, before or after that of etching the hole 30. Alternatively, only the conductive layer 14 may be etched, before the second dielectric layer 15 is deposited. The dielectric material 21 is then deposited above the first dielectric layer 13, filling the space between adjacent conductive layers 13, and may even form the second dielectric layer 15.

In some embodiments of the data storage element SE1, SE2, the metal plates 18-1, 18-2, contact 19, and even electrodes 16-1, 16-2 are not present. For example, in one embodiment of memory cell MC1, the bottom plate 18-1 is not present, and the bottom electrode 16-1 is formed directly above the third region R1. In another embodiment of memory cell MC2, the bottom electrode 16-1 is not present, and the resistive material 17 is formed above the well 42.

Finally, the skilled person may choose suitable materials for the fabrication of the memory cells according to the disclosure. For example, the top and bottom electrodes 16-1, 16-2 are preferably oxidation resistant metal layers, such as iridium (Ir), platinum (Pt), iridium oxide (IrO), titanium nitride (TiN), titanium aluminum nitride (TiAlN), ruthenium (Ru), ruthenium oxide (RuO), etc. Alternatively, the electrodes may be polysilicon layers.

The resistive material 17 may be may be of the type known as OxRAM (Oxide-Resistive Memory), nickel, niobium, titanium, zirconium, hafnium, cobalt, iron, copper, or chrome. The substrate 11 may be of silicon, gallium arsenide, germanium, germanium silicon, silicon-on-insulator, or other similar materials forming a support for an integrated circuit. The dielectric layers 13, 15 may be silicon dioxide ($SiO_2$), nitride, oxide-nitride-oxide (ONO), tetra-ethyl-ortho-silicate (TEOS) based oxides, boro-silicate-glass (BSG), boro-phosphate-silicate glass (BPSG), phosphate-silicate-glass (PSG), or other similar dielectric materials.

Finally, the semiconductor material 31 can be an amorphous semiconductor material, a polycrystalline semiconductor material, or a crystalline (i.e., mono-crystalline) semiconductor material. In the case of polycrystalline or amorphous material, it may crystalline by a crystallization process after deposition, depending on interface effects, such as with the semiconductor substrate, and the temperature and time profile.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of forming a vertical transistor, comprising:
    forming a well including dopants of a first conductivity type in a semiconductor substrate;
    forming a first dielectric layer over the well;
    forming a conductive layer over the first dielectric layer, the conductive layer being a semiconductor material including dopants of a second conductivity type;
    forming a second dielectric layer over the conductive layer, the second dielectric layer having a surface;
    forming a hole through the first dielectric layer, conductive layer, and second dielectric layer to expose a portion of the well;
    filling the hole with a semiconductor material and forming a layer of the semiconductor material on the surface of the second dielectric layer, the layer of semiconductor material having a surface;

forming a first conduction node of the vertical transistor in a first portion of the semiconductor material that is in the hole and adjoining the well;

diffusing dopants of the second conductivity type laterally from the conductive layer into a second portion of the semiconductor material in the hole adjoining the first portion of semiconductor material to form a control node of the vertical transistor; and forming a second conduction node of the vertical transistor from a third portion of the semiconductor material in the hole adjoining the second portion of semiconductor material.

2. The method of claim 1, wherein forming the first conduction node of the vertical transistor in the first portion of the semiconductor material that is in the hole and adjoining the well comprises diffusing dopants of the first conductivity type vertically from the well into the first portion of the semiconductor material to form the first conduction node of the vertical transistor.

3. The method of claim 1, wherein forming the second conduction node of the vertical transistor comprises:

implanting dopants of the first conductivity type in the surface of the semiconductor material in the hole and on the surface of the second dielectric layer; and diffusing the dopants in the layer of semiconductor material vertically into the third portion of the semiconductor material in the hole to form the second conduction node.

4. The method of claim 3, wherein diffusing dopants of the first conductivity type vertically from the well to form the first conduction node, diffusing dopants of the second conductivity type laterally from the conductive layer to form the control node of the vertical transistor, and forming the second conduction node of the vertical transistor comprise forming the first conduction node and the second conduction node having diffusion profiles that are thinner on the lateral edges and wider in the middle and forming the control node having a diffusion profile that is wider on the latter edges and thinner in the middle.

5. The method of claim 1, wherein filling the hole with the semiconductor material comprises filling the hole with a semiconductor material including dopants of the first conductivity type, and wherein forming the first and second conduction nodes of the vertical transistor comprise filling the hole with the semiconductor material to form the first and third portions of the semiconductor material in the hole.6. The method of claim 1, wherein forming the well including dopants of a first conductivity type in a semiconductor substrate comprises forming the well including N-type dopants and wherein forming the conductive layer on the first dielectric layer from a semiconductor material including dopants of a second conductivity type comprises forming the semiconductor material including P-type dopants.

6. The method of claim 1, wherein forming a hole through the first dielectric layer, conductive layer, and second dielectric layer to expose a portion of the well comprises:

depositing an etching mask on the surface of the second dielectric layer;

patterning the etching mask; and etching through the first dielectric layer, conductive layer, and second dielectric to form the hole that exposes the portion of the well.

7. The method of claim 1, wherein forming the conductive layer on the first dielectric layer comprises forming a polysilicon layer including dopants of a second conductivity type on the first dielectric layer.

8. The method of claim 1, wherein filling the hole with a semiconductor material and forming the layer of the semiconductor material on the surface of the second dielectric layer comprises filling the hole with undoped polysilicon and forming a layer of undoped polysilicon o the surface of the second dielectric layer.

9. The method of claim 1 further comprising removing the semiconductor material on the surface of the second dielectric layer and extending above the hole after formation of the first and second conduction nodes and the control node of the vertical transistor.

10. A method of forming a vertical transistor, comprising:

forming a well including dopants of a first conductivity type in a semiconductor substrate, the well having a surface;

forming a first dielectric layer over the well, the first dielectric layer having a surface;

forming a first hole through the first dielectric layer to expose a portion of the surface of the well;

filling the first hole with a first semiconductor material having a first conductivity type to form on the portion of the surface of the well a first conduction node of the vertical transistor, the first semiconductor material in the first hole having a surface;

forming a conductive layer over the surface of the first dielectric layer and on the surface of the first semiconductor material in the first hole, the conductive layer on the surface of the first semiconductor material in the hole forming a control node of the vertical transistor, the conductive layer having a surface and the control node having a surface;

forming a second dielectric layer over the surface of the conductive layer and the surface of the control node, the second dielectric layer having a surface;

forming a second hole through the second dielectric layer to expose the surface of the control node; and filling the second hole with a second semiconductor material having the first conductivity type to form on the surface of the control node a second conduction node of the vertical transistor.

11. The method of claim 10, wherein forming the conductive layer over the surface of the first dielectric layer and on the first semiconductor material in the first hole comprises forming a third semiconductor material having a second conductivity type on the surface of the first dielectric layer and on the first semiconductor material in the first hole to form the control node.

12. The method of claim 11, wherein filling the first and second holes with the first and second semiconductor materials having the first conductivity type to form the first and second conduction nodes comprises filling the first and second holes with an N-doped semiconductor material, and wherein forming the third semiconductor material having the second conductivity type on the surface of the first dielectric layer and on the first semiconductor material in the first hole comprises forming a P-doped semiconductor material on the surface of the first dielectric layer and the first semiconductor material in the first hole.

13. The method of claim 10, wherein filling the first hole with the semiconductor material having the first conductivity type to form the first conduction node of the vertical transistor comprises:

filling the first hole with the first semiconductor material having the first conductivity type and forming a layer of the first semiconductor material on the surface of the first dielectric layer;

removing the first semiconductor material on the surface of the first dielectric layer and extending over the first hole so the first semiconductor material in the first hole has a surface that is planar with the surface of the first dielectric layer.

14. The method of claim 10, wherein filling the first and second holes and forming the conductive layer comprises utilizing one or more of silicon, gallium arsenide, germanium, and germanium silicon.

15. A method of forming a memory cell, comprising:
forming a data storage element;
forming a vertical transistor that is electrically coupled to the data storage element, the forming of the vertical transistor including,
  forming a well including dopants of a first conductivity type in a semiconductor substrate;
  forming a first dielectric layer over the well;
  forming a conductive layer over the first dielectric layer, the conductive layer being a semiconductor material including dopants of a second conductivity type;
  forming a second dielectric layer over the conductive layer, the second dielectric layer having a surface;
  forming a hole through the first dielectric layer, conductive layer, and second dielectric layer to expose a portion of the well;
  filling the hole with a semiconductor material and forming a layer of the semiconductor material on the surface of the second dielectric layer, the layer of semiconductor material having a surface;
  diffusing dopants of the first conductivity type vertically from the well into a first portion of the semiconductor material that is in the hole and adjoining the well to form the first conduction node of the vertical transistor;
  diffusing dopants of the second conductivity type laterally from the conductive layer into a second portion of the semiconductor material in the hole adjoining the first portion of semiconductor material to form a control node of the vertical transistor; and
  forming a second conduction node of the vertical transistor from a third portion of the semiconductor material in the hole adjoining the second portion of semiconductor material.

16. The method of claim 15, wherein forming the data storage element comprises forming one of a resistive storage element, a phase change memory storage element, a dynamic random access memory storage element, a static random access storage element, a magnetic memory storage element, and a ferromagnetic memory storage element.

17. The method of claim 16, wherein forming the data storage element comprises forming a resistive storage element including a first metal electrode, a resistive material, and a second metal electrode, and wherein one of the first and second metal electrodes is coupled to either the first conduction node or the second conduction node of the vertical transistor.

18. The method of claim 15, wherein forming the data storage element comprises electrically coupling the data storage element to the first conduction node.

19. The method of claim 15, wherein forming the data storage element comprises electrically coupling the data storage element to the second conduction terminal.

20. The method of claim 15 wherein forming the second conduction node of the vertical transistor comprises:
  implanting dopants of the first conductivity type in the surface of the layer of semiconductor material; and
  diffusing the dopants in the layer of semiconductor material vertically into the third portion of the semiconductor material in the hole to form the second conduction node; and
  wherein the doping concentrations in the well, the conductive layer and the semiconductor material filling the hole and forming the layer of the semiconductor material on the surface of the second dielectric layer is approximately $10^{20}$ to $10^{21}$ cm$^{-3}$.

* * * * *

UNITED STATES PATENT AND TRADEMARK OFFICE
CERTIFICATE OF CORRECTION

PATENT NO.          : 10,128,314 B2
APPLICATION NO.     : 15/398228
DATED               : November 13, 2018
INVENTOR(S)         : Philippe Boivin et al.

Page 1 of 1

It is certified that error appears in the above-identified patent and that said Letters Patent is hereby corrected as shown below:

In the Claims

Column 9, Lines 40-54:
"5. The method of claim 1, wherein filling the hole with the semiconductor material comprises filling the hole with a semiconductor material including dopants of the first conductivity type, and wherein forming the first and second conduction nodes of the vertical transistor comprise filling the hole with the semiconductor material to form the first and third portions of the semiconductor material in the hole.6. The method of claim 1, wherein forming the well including dopants of a first conductivity type in a semiconductor substrate comprises forming the well including N-type dopants and wherein forming the conductive layer on the first dielectric layer from a semiconductor material including dopants of a second conductivity type comprises forming the semiconductor material including P-type dopants."

Should read:
--5. The method of claim 1, wherein filling the hole with the semiconductor material comprises filling the hole with a semiconductor material including dopants of the first conductivity type, and wherein forming the first and second conduction nodes of the vertical transistor comprise filling the hole with the semiconductor material to form the first and third portions of the semiconductor material in the hole.--.

Signed and Sealed this
First Day of December, 2020

Andrei Iancu
*Director of the United States Patent and Trademark Office*